United States Patent
Knopik

(10) Patent No.: US 9,166,527 B2
(45) Date of Patent: Oct. 20, 2015

(54) AMPLIFICATION CIRCUIT HAVING OPTIMIZATION OF POWER

(75) Inventor: Vincent Knopik, St. Pierre d'Allevard (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 142 days.

(21) Appl. No.: 13/996,758

(22) PCT Filed: Jan. 26, 2012

(86) PCT No.: PCT/EP2012/000351
§ 371 (c)(1),
(2), (4) Date: Jan. 2, 2014

(87) PCT Pub. No.: WO2012/100947
PCT Pub. Date: Aug. 2, 2012

(65) Prior Publication Data
US 2014/0197893 A1    Jul. 17, 2014

Related U.S. Application Data

(60) Provisional application No. 61/454,076, filed on Mar. 18, 2011.

(30) Foreign Application Priority Data

Jan. 27, 2011 (EP) .................................. 11368002

(51) Int. Cl.
| | | |
|---|---|---|
| *H03F 1/22* | (2006.01) | |
| *H03F 1/02* | (2006.01) | |
| *H03F 3/193* | (2006.01) | |
| *H03F 3/21* | (2006.01) | |
| *H03F 3/72* | (2006.01) | |

(52) U.S. Cl.
CPC ................ *H03F 1/02* (2013.01); *H03F 1/0277* (2013.01); *H03F 3/193* (2013.01); *H03F 3/21* (2013.01); *H03F 3/211* (2013.01); *H03F 3/72* (2013.01); *H03F 2200/453* (2013.01)

(58) Field of Classification Search
USPC ........................... 330/295, 124 R, 286, 53, 84
See application file for complete search history.

(56) References Cited

U.S. PATENT DOCUMENTS

| | | |
|---|---|---|
| 4,458,213 A | 7/1984 | Quan |
| 6,448,616 B1 | 9/2002 | Perugupalli et al. |

(Continued)

FOREIGN PATENT DOCUMENTS

| | | |
|---|---|---|
| EP | 1 858 161 A1 | 11/2007 |
| EP | 1 993 200 A1 | 11/2008 |
| WO | 2009/009652 A2 | 1/2009 |

OTHER PUBLICATIONS

International Search Report issued in corresponding International application No. PCT/EP2012/000351, date of mailing Apr. 4, 2012.

*Primary Examiner* — Hieu Nguyen
(74) *Attorney, Agent, or Firm* — Patent Portfolio Builders PLLC

(57) ABSTRACT

A Power amplifier circuit comprising an input, an output comprising:
   means for sensing the input voltage; and
   a set of n cascode circuits, each comprising a first transistor having a gate, a source and a drain terminal and further comprising a second transistor having gate, source and drain terminal; the source and gate of the first transistor of said cascode circuits being respectively connected to a first reference voltage and to receive the input signal, the drain of said first transistor being connected to the source of said second transistor, the drain of which being coupled to said output.
By activating or deactivating one or more of the n cascode circuits, the total size of the amplification components can be adapted to the value of the output power to generate.

12 Claims, 11 Drawing Sheets

(56) References Cited

U.S. PATENT DOCUMENTS

| | | |
|---|---|---|
| 6,501,334 B1 | 12/2002 | Corsi et al. |
| 8,150,343 B2 * | 4/2012 | Ramachandra Reddy . 455/127.2 |
| 8,188,788 B2 * | 5/2012 | Lee .................................. 330/51 |
| 2005/0225392 A1 | 10/2005 | Ivanov |
| 2010/0141337 A1 | 6/2010 | Chen |
| 2010/0279641 A1 | 11/2010 | Lu et al. |

* cited by examiner

Simulation

- 2.5GHz PA 25dBm

No change at the input

AMPLIFICATION CIRCUIT HAVING OPTIMIZATION OF POWER

TECHNICAL FIELD

The invention relates to power amplifiers and more particularly to a Class AB power amplification which offers good linearity and low current consumption.

BACKGROUND ART

The development of wireless mobile communications and Radio Frequency (RF) standards have entailed the need of linear Power Amplifiers (PA) while reducing the power consumption on the battery.

Some techniques are already known for improving the efficiency of RF power amplifiers, based on the use of complex circuits, sophisticated linearization circuits and feedback loop.

Another simple structure which is known is based on the class AB power amplifier having an input 6 and an output 7, such as illustrated in FIG. 1, which comprises a MOS transistor 1 having a gate receiving, through a capacitor 4 an input signal Vin (RFinput) and a drain connected to a Vdd voltage via an inductor 2 and also connected to the RF out output terminal 7 (driving a load ZL 5) via an output capacitor 3.

FIGS. 2a and 2b are flow charts respectively illustrating both the current consumption $I_{cons}$ (as a function of the output power $P_{Pout}$) and the gain $G_m$ of such amplifier depending on the size of the transistor. It can be seen that the current consumption follows a curve that is function of the input RF swing as presented in FIG. 1. For a targeted output power $P_{out}$, a load ZL is determined and $I_{cons}$ is then mainly driven by $P_{out}$. The quiescent current $I_q$ has been represented in FIG. 2a and corresponds to the point of no or little RF input signal. This particular point is determined by an appropriate biasing circuit (not illustrated in FIG. 2) which is DC set regarding bias point at G and transistors size.

When one considers the situation of high levels of the input signal or, in other words when the output power becomes higher, one determines the particular size of the transistor accordingly, by considering current capabilities (electromigration for instance).

The Power Gain (PG) is mainly given by the ratio between the output voltage and the input voltage. Typically PG is around 8-10 dB. Moreover, because of a possible "oversizing", the typical gain (or gm) for a MOS transistor is not linear anymore with the size, as illustrated in FIG. 2b, especially once the cell is sized for current.

The drawback resulting from a high size of the transistor comes from the fact that the latter then shows an efficiency (Power Amplifier Efficiency PAE) which is no longer optimized because of higher quiescent current Iq. Linearity is also an issue because of too much capacitance at the transistor ports.

Clearly, the power amplifier is sized at high power but not at low power which represents 80% of the time.

There is therefore a dilemma to be considered with the simple amplification structure of FIG. 1.

Either the designer focuses on the power consumption and the transistor is then (under)sized so as to only draw minimal quiescent current $I_q$.

Or conversely, the designers may decide to (over)size the transistor so as to generate a high amount of power $P_{out}$, thus increasing the value of the quiescent current $I_q$.

There is therefore a desire for a new circuit which aims at reducing the power consumption and particularly $I_q$ and also shows a high linearity even at high level of output power $P_{out}$.

Such is the aim of the present invention.

SUMMARY OF THE INVENTION

It is an object of the present invention to provide the architecture of an amplification circuit which offers good linearity and low current consumption.

It is a further object of the present invention to provide a Class AB amplification circuit.

It is still another object of the present invention to provide a AB amplification circuit which is adapted for the design of Radio Frequency amplifiers for wireless communications.

It is another object of the present invention to provide a RF amplification circuit which can be used in a mobile telephone.

These and other objects of the invention are achieved by means of a power amplifier circuit comprising:
  means for sensing the input voltage;
  a set of n cascode circuits, each comprising a first transistor having a gate, a source and a drain terminal and further comprising a second transistor having gate, source and drain terminal; the source and gate of the first transistor of said cascode circuits being respectively connected to a first reference voltage (GND) and to receive the input signal (RFin), the drain of said first transistor being connected to the source of said second transistor, the drain of which being coupled to the output;
  a control circuit receiving the input voltage sensed by the sensing means for generating a set of control signals which are transmitted to the gates of the second transistors of said n cascode circuits;

By activating or disactivating one or more of the n cascode circuits, the total size of the amplification components can be adapted to the value of the output power to generate.

In one embodiment, each of the second transistor is biased, when activated by the control circuit, in class AB showing a quiescent current Iq.

In one embodiment, the sensing means comprises:
  an additional cascode circuit a first transistor having a gate, a source and a drain terminal and further comprising a second transistor having gate, source and drain terminal; the source and gate of the first transistor of said cascode circuits being being respectively connected to the reference voltage (GND) and to receive the input signal (RFin), the drain of the first transistor being coupled to the source of the second transistor,
  a passive circuit coupled between a second reference voltage (Vdd) and the drain of said second transistor of said additional cascode circuit, the passive circuit comprising two resistors mounted as a voltage divider and, in parallel, one capacitor for averaging the RF signal sensed by said sensing means.

The invention also achieves a power amplification circuit comprising
  a first MOS transistor having a lower size and biased in class AB amplification, having a gate, source and drain terminal, the source being connected to the ground and the gate being coupled to receive the input signal;
  a second MOS transistor having a higher size and biased in class A, having a gate, source and drain terminals, the source being connected to the ground and the gate being coupled to receive the input signal;
the drains of said first and said second MOS transistor being coupled together to generate the output current to drive the load of said power amplification circuit;

whereby when the input signal increases the Class AB contribution increases while Vout from Class A decreases (compression), thus smoothing the total gain of said power amplification circuit.

In one embodiment, the a third transistor is mounted as a cascode transistor on the top of both first and second transistors.

The invention is adapted to the design of a RF amplification circuit for wireless communications and particularly useful for realizing a mobile telephone.

DESCRIPTION OF THE DRAWINGS

Other features of one or more embodiments of the invention will best be understood by reference to the following detailed description when read in conjunction with the accompanying drawings.

DESCRIPTION OF THE PREFERRED EMBODIMENT

There is now described improvements which can be brought to RF amplification circuits and particularly to the conventional deep Class AB cascode amplification circuit. In the following GND will refer to a first reference voltage and Vdd is a second reference voltage which may correspond to either a positive voltage or a negative voltage, thus determining the particular type of the transistor to consider. For instance, when Vdd is a positive voltage, the MOS transistors will be NMOS transistors while, if Vdd correspond to a negative voltage, PMOS transistors will have to be considered.

Typically, the embodiments described below are particularly adapted to the design of Radio Frequency amplification circuits used in modern mobile telecommunication equipments, requiring a high degree of linearity, together with a low consumption of current.

Figure 1:
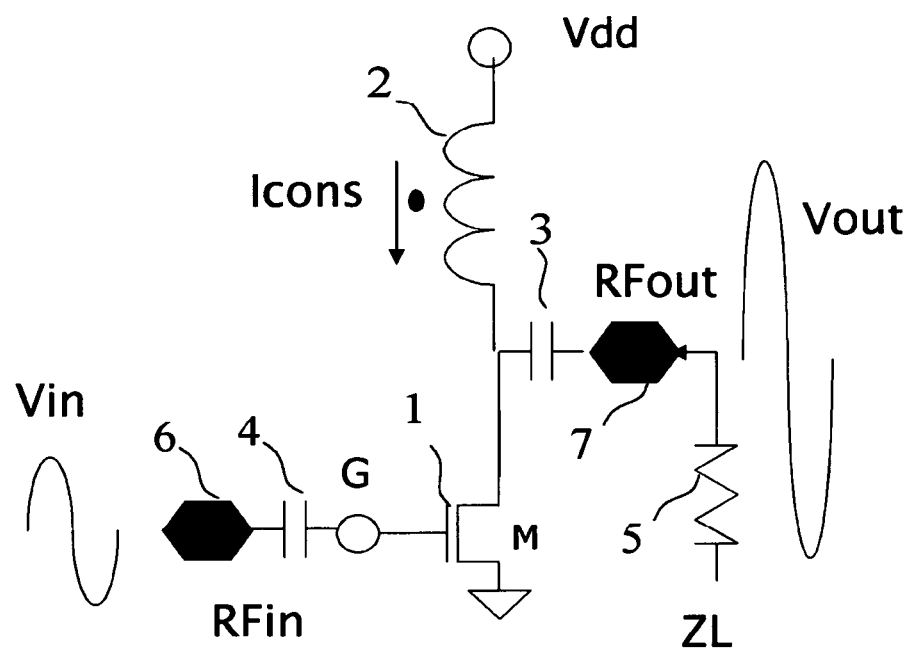
FIG. 1 illustrates the basic structure of a RF power amplification structure.
Figure 2A:
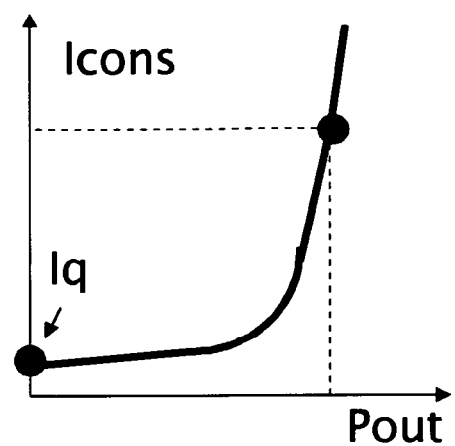
FIGS. 2a and 2b are flow charts illustrating both the current Icons and the gain Gm of the amplifier of FIG. 1.
Figure 2B:
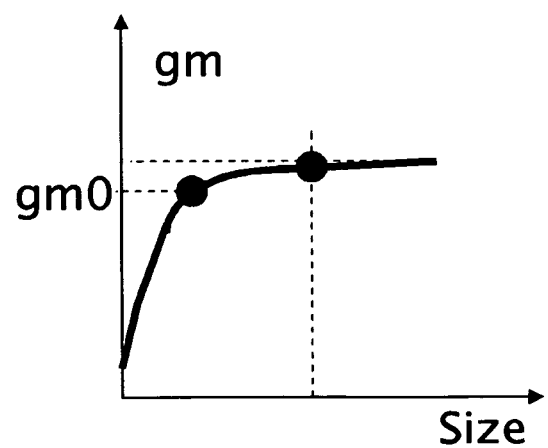
Figure 3A:
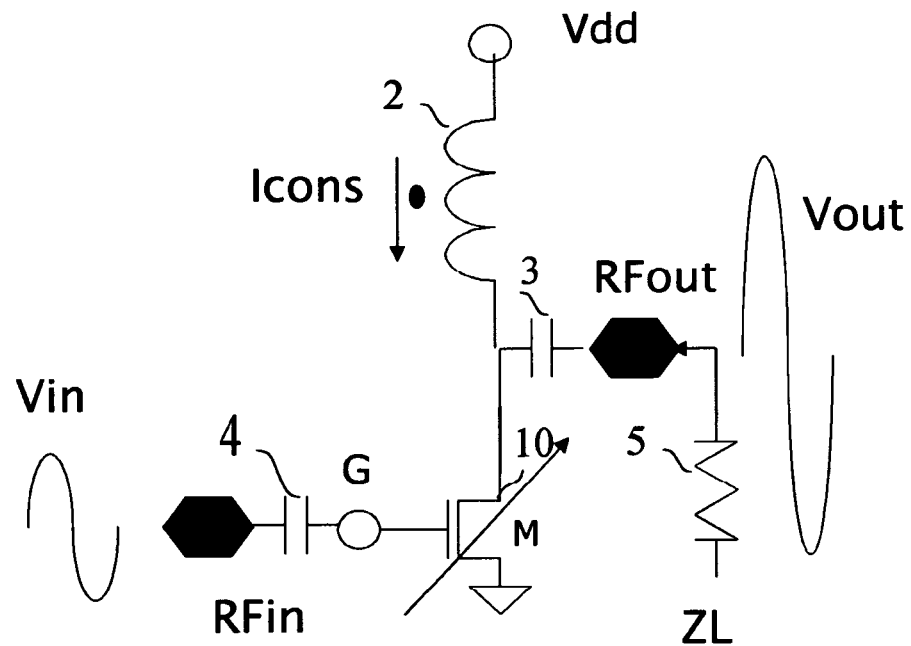
FIGS. 3a and 3b illustrate the general principle of a so-called Deep Class AB Cascode Power amplifier based on a "variable size" transistor.

This is achieved by the use of a new amplification circuit, illustrated in FIG. 3, and including one specific component, shown as a "variable" transistor, e.g. of a a 'variable size' transistor 10 allowing adaptive control of its size in accordance with the output power which is desired.

Figure 3B:
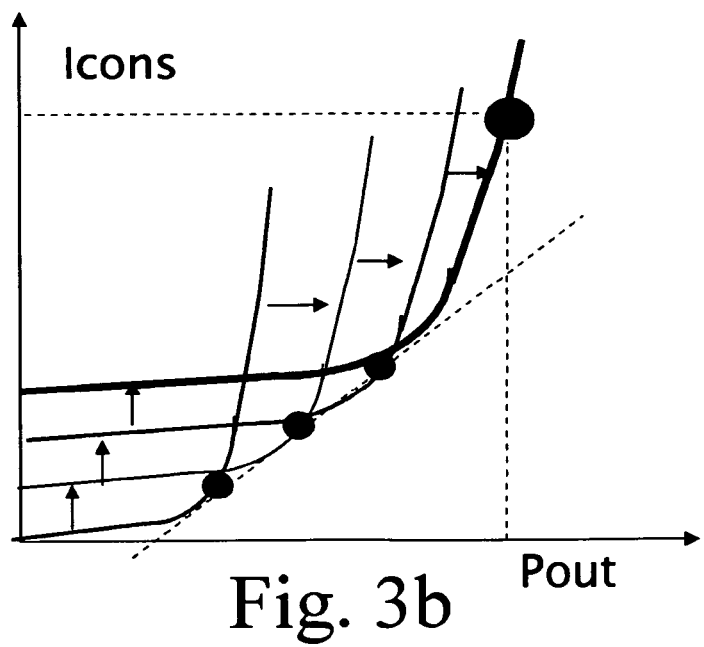

By construction, such "variable size" transistor, when used in a Class AB structure, allows to take advantage of different Icons (Pout) curves so as to leave the operating point on the tangent shown in FIG. 3b, thus optimizing the power consumption and the output power.

For that purpose, the size of "transistor" 10 is varied, in a controllable way, with the targeted power. More particularly, there is included control means for increasing the size of transistor 10 with the reaching of a percentage of Iq (Icons), which is given by linearity consideration (limit between deep Class AB and ClassAB for instance)

Doing this, both the quiescent current and $I_{cons}$ increase with Pin (and Pout) while ensuring power capabilities, respecting targeted PAE.

At low power, PAE is better because quiescent current $I_q$ decreases also.

The main advantage regarding classical envelope restoration is that $I_{cons}$ is an image of Output Power (and input one at large signal), so $I_{cons}$ is in phase with output swing.

Two particular embodiments will be particularly considered, a first embodiment taking advantage of a series of MOS transistors coupled in parallel and all biased in Class AB structures (I) and a second embodiment (II) showing the combination of a MOS transistor biased in class AB and combined with a class A structure.

First Embodiment

Combination of AB Classes Structures

Figure 4:
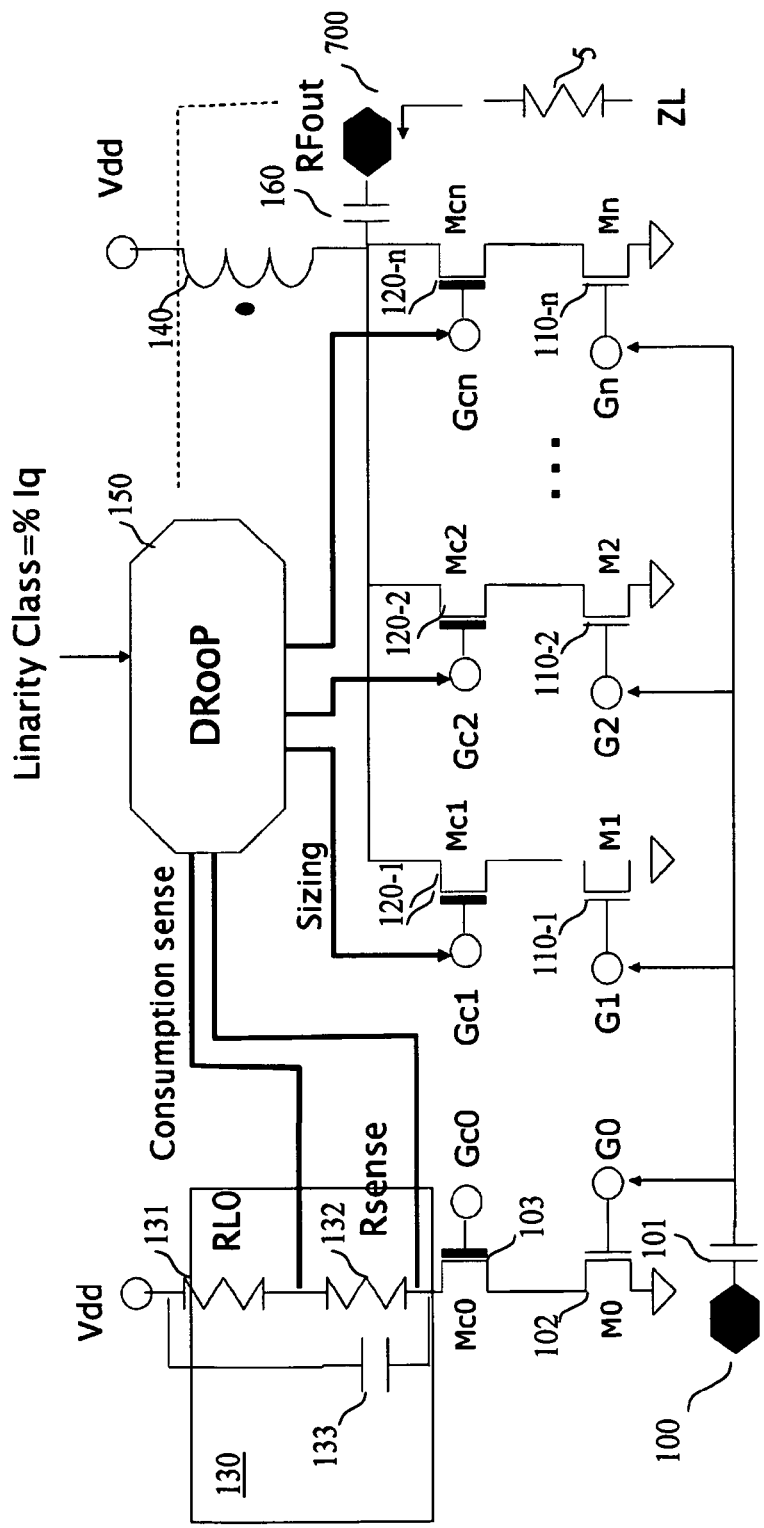
FIG. 4 illustrates a first embodiment of a Deep Class AB cascode Power amplifier using adaptive control of the size of the transistor in response to the input voltage.

FIG. 4 illustrates one embodiment of a class AB cascode amplification circuit using a series of MOS transistors.

The circuit comprises an input 100 receiving the input signal and connected to a first input of a capacitor 101 having a second input connected to the gate (G0) of a transistor M0 102 and also to the gate (G1, G2, ... Gn) of a series of n MOS transistors 110-1 to 110-n, the source of which being connected to a reference voltage Gnd.

Transistors M1-Mn have their drains which are respectively connected to the source of an associated transistors 120-1-120-n, the drain of which being connected to the output of the amplifier, that is to say to a first input of an inductor 140 having a second input connected to reference voltage Vdd, and also to a first input of capacitor 160, the second input of which being connected to an output 700 (Rfout) and to the load ZL 5. Therefore, the amplification circuit comprises a set of n cascode circuits, each cascode circuit comprising a first transistor (110-1, 110-2, ... 110-n) and a second transistor (120-1, 120-2, ... 120-n).

Likewise, the drain of transistor M 102 is connected to the source of a transistor Mc0 103 having its drain connected to Vdd via a sensing circuit 130 connected to reference voltage Vdd. Sensing circuit 130 includes a first branch two resistors 131 and 132 connected in series between the reference voltage Vdd and the drain of transistor Mc0 103. The voltage across one of the two resistors connected in series, namely resistor 132 is sensed and forwarded to a control unit 150 (so-called Droop circuit), having a set of output lends which are coupled to the gates Gc1, Gc2 ... Gcn of the sequence of NMOS transistors 120-1, 120-2 ... 120-n Therefore, as seen in FIG. 4, the system will sense the $I_q$ depending on RFin and choose the right size of the variable PA in order to optimize the Efficiency of the Power Amplifier (PAE). A connection to power detection control loop can help also the system.

Figure 5A:
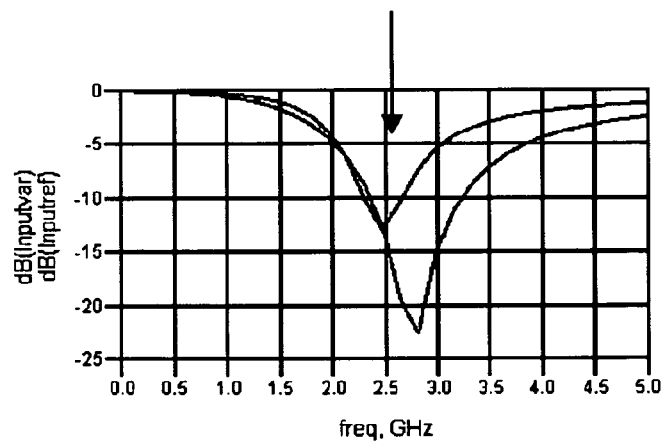
FIGS. 5a and 5b illustrate the result of a simulation for a 2.5 Ghz power amplifier.
Figure 5B:
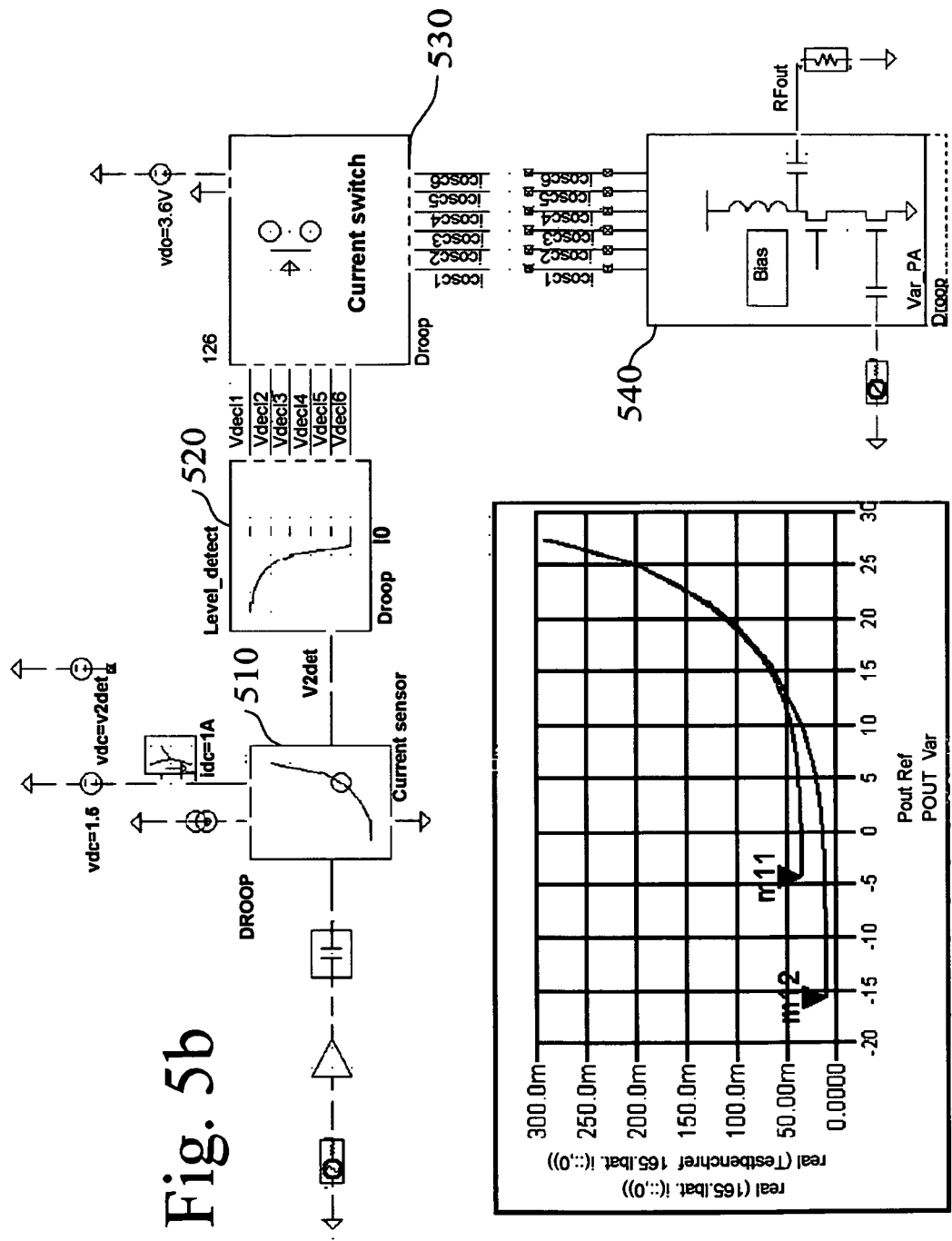

The TOP schematic is presented in FIG. 5b. It includes a Current sensor 510, a Level detector 520, a Biasing switch 530, and a switchable size PA.

With respect to FIG. 4 again, it can be seen that the sensing of the current is based on the use of 2 or more transistors (eg transistors 102 and 103) functioning in RF that receive an image of the input signal applied to the total PA. Sensing circuit 130 comprising resistor 132 and a capacitor 133 serves for averaging the signal at the drain of the sense transistor 103, gives a dc value of the quiescent current of this transistor versus the input power. This signal is transferred to control circuit 150 comprising a bank of comparators for creating e steps and control the size of the final PA being equivalent to the structure formed of transistors M1-Mn.

Figure 7:
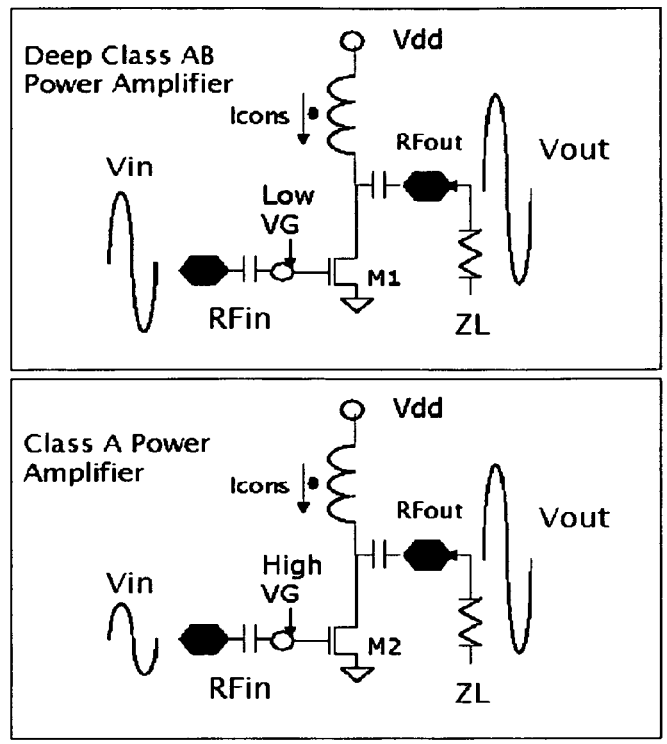
FIGS. 7 and 8 illustrate a second embodiment and gives the consumption profile of a deep Class AB PA with a high size together with the one of a Class A PA with a lower size.

FIG. 7 presents the main results which can be obtained with the first embodiment. The current consumption at low output power is reduced compared to the one of conventional stage. Moreover, the impact on the input impedance matching is very small. At higher output power the system keeps the performances of the conventional PA.

It can therefore be seen that the first embodiment advantageously saves power consumption at low power for ClassAB PA. In addition it takes small area and can be implemented in pure CMOS technology. Furthermore, there is no need of a specific digital circuit to tune the stages. This can be done in pure analog domain. It can be implemented as a standalone circuit.

Second Embodiment

Combination of AB Classes Structures

The second embodiment which is described below is particularly adapted for handling the more recent modulation techniques, having high PAPR (Peak to Average Power Ratio) (6-10 dB), and which require very good linearity combined with low power consumption as well.

Figure 6:
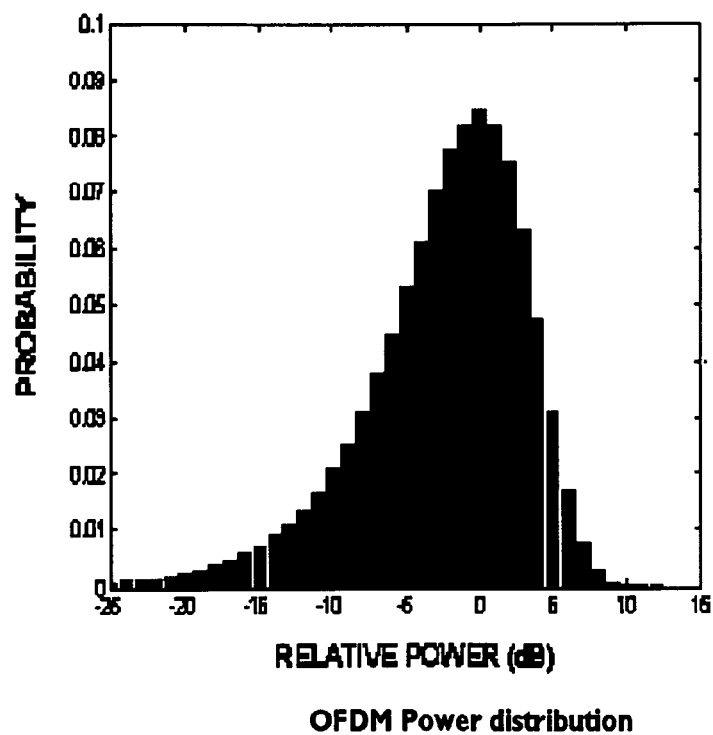
FIG. 6 gives the power distribution of an OFDM signal.

For that purpose, there is described a twin power amplifier which takes advantage of the property of an OFDM signal having a high PAPR to statistically distribute the power around Pout average and up to Pout maximum, as illustrated in FIG. 6. Even if all the Power is transferred by the PA, most of the linear information is at low power while the consumption should be low at high power.

Figure 8:
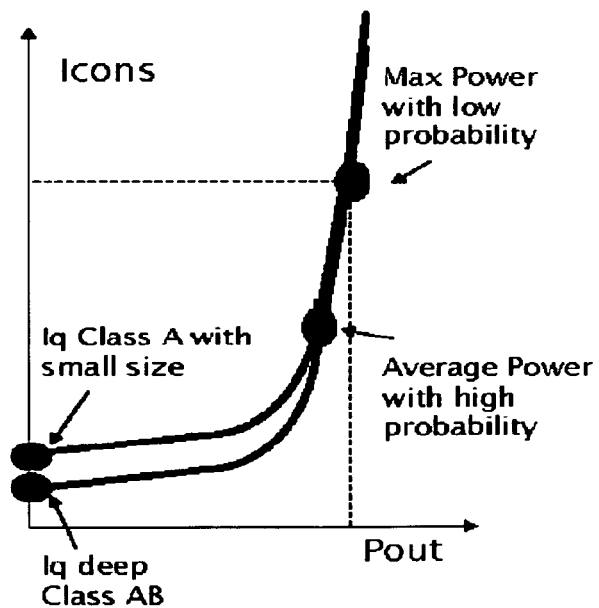

FIGS. 7 and 8 gives the consumption profile of a deep Class AB PA with a high size together with the one of a Class A PA with a lower size. Since the Class A size is low the Iq can be low but still providing the right output signal (Vout versus Vin). In a same way, since the Class AB size is high but biasing low (VG on the fig) the quiescent is low. When the input signal increases, its dc current increases and also its gain (expansion) providing a good Vout (once Vin is high enough)

Therefore, as illustrated in FIG. 7 representing two power amplifiers, respectively a deep Class AB power amplifier and a class A amplifier, most of the time the input signal is low and a small ClassA PA is sufficient to provide the gain with a great linearity and without consuming too much. When the input signal becomes higher to reach Pmax, a Class AB is preferable to provide this power with low consumption. The linearity is mainly driven by signals at lower power which are "boosted" by the Class A biasing.

FIG. 8 more particularly illustrates the current $I_{cons}$ for the two amplifiers. There is thus shown the consumption profile of a deep Class AB PA with a high size together with the one of a Class A PA with a lower size. Since the Class A size is low the Iq can be low but still providing the right output signal (Vout versus Vin). In a same way, since the Class AB size is high but biasing low (VG on the fig) the quiescent is low. When the input signal increases, its dc current increases and also its gain (expansion) providing a good Vout (once Vin is high enough)

Figure 9:
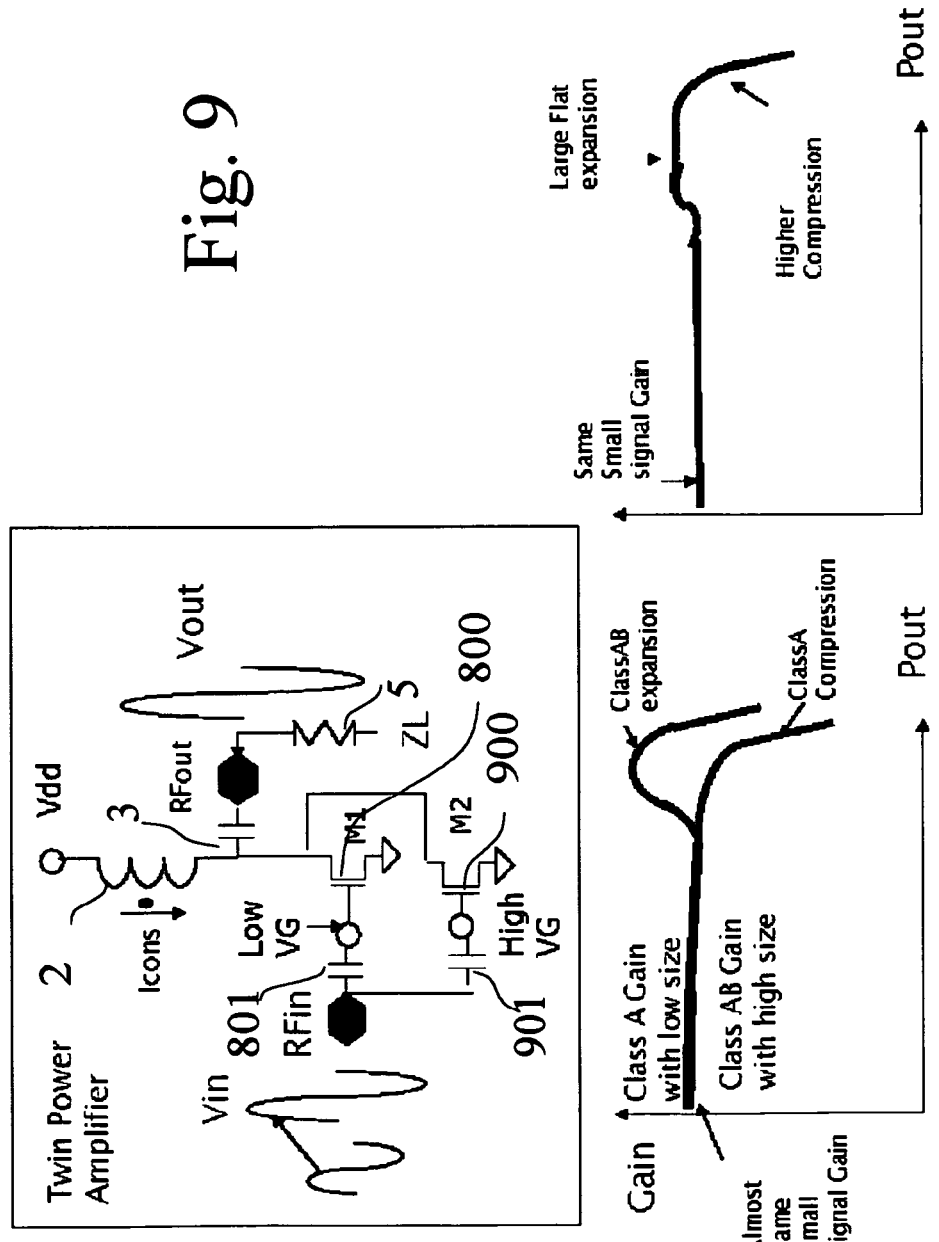
FIG. 9 shows the second embodiment wherein both Class A and Class AB structures are merged together.

In order to take advantage of both circuits, there is proposed a twin power amplifier, as illustrated in FIG. 9, which shows two MOS transistors 800 and 900, respectively having lower and higher size and their source connected to Ground, driving a load ZL 5 via a capacitor 3 and also an inductor 2 connected between Vdd and the drain of both transistors.

On one hand, lower size MOS transistor M1 is biased in class A and receives the RF input at its gate via a capacitor 801.

On the other hand, MOS transistor M2 is biased in Class AB and also receives the RF input at its gate via a capacitor 901.

Therefore, the ClassA and AB are merged together. When the input signal increases the ClassAB contribution increases while Vout from Class A decreases (compression). The total gain is smoothed.

The twin structure of FIG. 9 thus includes 2 transistors connected by Drain and Source, with 2 different sizes and biased by 2 different networks, the determination of the sizes and the biasing networks being performed by taking into consideration the modulated shape and PAPR to optimize both linearity and consumption.

Regarding the determination of the size, it is proposed, in one particular embodiment, to provide the Class A part with, for instance ⅓ of the total area, the remaining ⅔ being allocated to the Class AB part. Clearly, those values can be changed but the skilled man will take care to keep the contribution of each part should be balanced. The biasing points also in an opposite ratio. Doing this, if the Class A part with ⅓ of the total area (so ⅓ of the total Gain (gm)) has a high biasing point, its contribution to the gain is high. A Class A PA has a gain proportional to the biasing point. Now, if the Class AB part which represents ⅔ of the total area, so ⅔ of the total available gain, has a lower biasing point, this part will have a lower gain than the maximum available gain (given by the area).

Now considering the determination of the ratio and biasing point those are chosen so that each part contributes to the same power gain. Doing this, when the input power increases the Class AB part contribution becomes higher and higher producing an expansion of its gain but the Class A part which is sized lower will compress earlier reducing its intrinsic gain. The two behaviours compensate the gain expansion making it smaller and finally pushing the total compression point P1db at a higher value. This increases the linearity without degrading the consumption. The gain expansion is reduced and smoothed on a larger input power range. This range corresponds in fact to the PAPR. So, the power gain, which is the gain at the targeted output power can be seen constant. The compression point is then rejected to a higher value than a pure Class AB PA. The advantage is that the consumption behaviour is still the one of a Class AB at high power but keeping the linearity.

Figure 10:
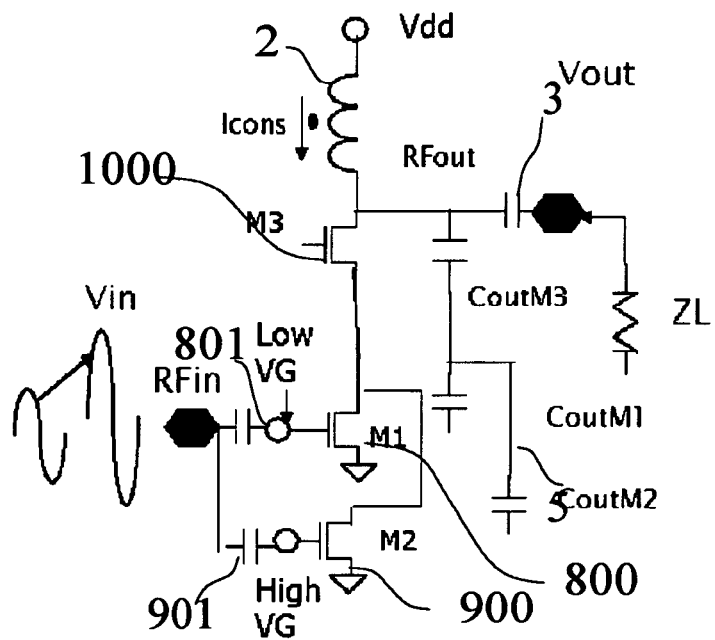
FIG. 10 illustrates the second embodiment with the cascode transistor

Considering now FIG. 10, there is disclosed one embodiment of a twin power amplifier (the same elements already discussed in FIG. 9 keeping the same references) which further includes a third transistor M3 1000 which has the drain and source connected in series between the drain of transistors 800 and 900 and the output lead. Transistor M3 which is located on the top of the combination (cascode) is used to combine and isolate each structure from load variation ensuring better linearity. Indeed, the output capacitance of a MOS transistor is a function of power. This capacitance is non linear and should be reduced and/or compensated. This is the goal of the output matching network. However, is the Class AB contribution is low when input power is low, its capacitance will be low. When the input power increases, this capacitance will increase providing non linearities The cascode transistor is reducing this behaviour by putting in series its own output capacitance, reducing the overall contribution in a same way. So there is no variation of the imaginary part. So no variation of the load. This is a big difference with classical Doherty linearization techniques which need to match the load to each PA (classAB and ClassA). Here we connect the 2 PA to a common cascode transistor. Moreover the layout of the 2 transistor is common. Only the grid access is separated. Both transistors will see exactly the same drain voltage swing but will provide their own current contribution.

Figure 11:
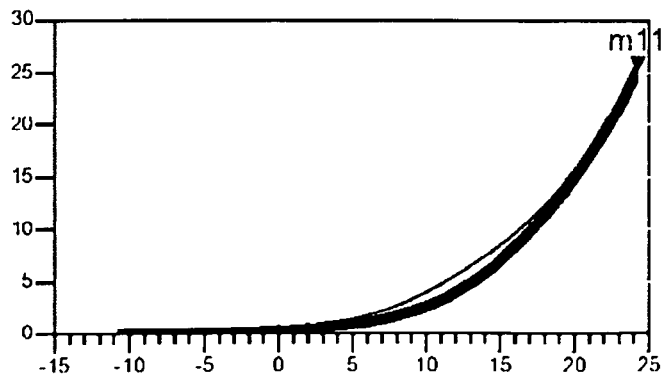
FIG. 11 illustrates the efficiency of the Power Amplifier of the pure ClassAB PA and the one using the structure. One may notice that there is almost no difference FIG. 12 gives the linearity of the pure ClassAB PA and the one using the structure. The linearity is far better using the structure. At medium power (Pout from 10 to 16 dBm) EVM is up to 10 dB better. At high power, EVM is the same but mask is improved.
Figure 12:
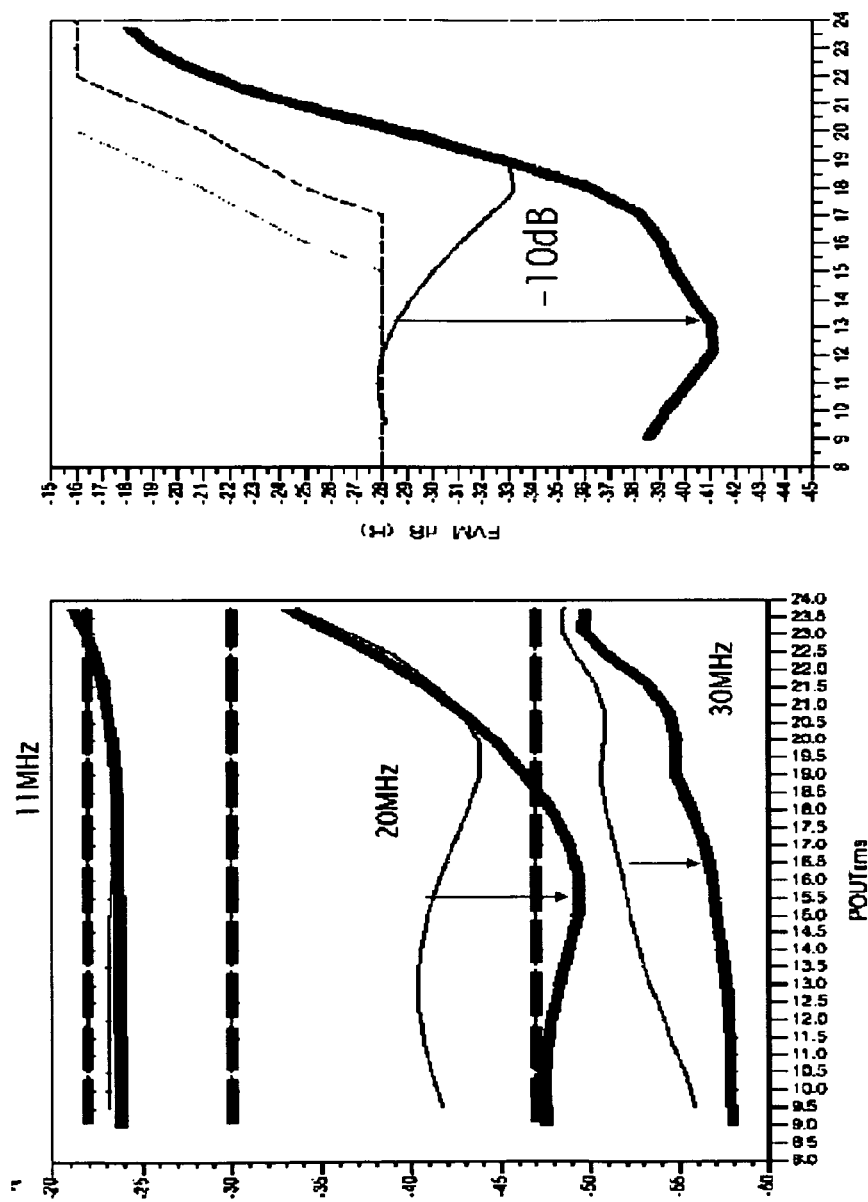

FIG. 11 gives the PAE of the pure ClassAB PA and the one using the structure. One may notice that there is almost no difference FIG. 12 gives the linearity of the pure ClassAB PA and the one using the structure. The linearity is far better using the structure. At medium power (Pout from 10 to 16 dBm) EVM is up to 10 dB better. At high power, EVM is the same but mask is improved.

The invention claimed is:

1. Power amplifier circuit comprising an input, an output comprising:
   means for sensing an input voltage;
   a set of n cascode circuits, each comprising a first transistor having a gate, a source and a drain terminal and further comprising a second transistor having gate, source and drain terminal; the source and gate of the first transistor of said cascode circuits being respectively connected to a first reference voltage and to receive the input signal, the drain of said first transistor being connected to the source of said second transistor, the drain of which being coupled to said output; and
   a control circuit receiving the input voltage sensed by said sensing means for generating a set of control signals which are transmitted to the gates of the second transistors of said n cascode circuits;
   wherein the means for sensing the input voltage comprises:
      an additional cascode circuit in communication with the first reference voltage and the input signal; and
      a passive circuit in communication with the additional cascode circuit and a second reference voltage;
   so as to activate or deactivate some of said n cascode circuits and adapt the size of the transistors to the output power to issue to a load.

2. Power amplifier circuit according to claim 1 wherein each of said second transistor is biased, when activated by said control circuit, in class AB showing a quiescent current Iq.

3. Power amplifier circuit according to claim 1 wherein:
   the additional cascode circuit comprises a first transistor having a gate, a source and a drain terminal and a second transistor having gate, source and drain terminal; the source and gate of the first transistor of said cascode circuits being respectively connected to the first reference voltage and to receive the input signal, the drain of said first transistor being coupled to the source of said second transistor, and
   the passive circuit is coupled between the second reference voltage and the drain of said second transistor of said additional cascode circuit, said passive circuit comprising two resistors mounted as a voltage divider and, in parallel, one capacitor for averaging the RF signal sensed by said sensing means.

4. Power amplifier circuit according to claim 3 wherein the voltage across one of said resistors is transmitted to one input of said control circuit so as to determine the magnitude of the input signal to be amplified and, therefore, the number of cascode elements to activate/deactivate.

5. Power amplifier circuit according to claim 1 wherein it is used for embodying a Radio Frequency amplifier.

6. Power amplification circuit according to claim 1 wherein it is used in a mobile telephone.

7. Power amplification circuit comprising
   a first MOS transistor biased in class AB amplification, having a gate, source and drain terminal, the source being connected to the ground and the gate being coupled to receive an input signal; and
   a second MOS transistor biased in class A, having a gate, source and drain terminals, the source being connected to the ground and the gate being coupled to receive the input signal;
   wherein said first and said second MOS transistors are coupled together by drains and sources to generate the output current to drive the load of said power amplification circuit; and
   the first MOS transistor comprises a higher area than the second MOS transistor and a lower biasing point than the second MOS transistor; and
   whereby when the input signal increases the Class AB contribution increases while Vout from Class A decreases (compression), thus smoothing the total gain of said power amplification circuit.

8. Power amplification circuit according to claim 7 wherein it further comprises a third transistor mounted as a cascode transistor on the top of both first and second transistors, said cascode transistor having its source connected to the drains of said first and second transistors and a drain coupled to the output of said amplifier.

9. Power amplification circuit according to claim 7 wherein it is used for embodying a RF amplification for wireless mobile telecommunications.

10. Mobile equipment comprising one amplification circuits as defined in claim 1.

11. Power amplifier circuit comprising an input, an output comprising:
   means for sensing an input voltage;
   a set of n cascode circuits, each comprising a first transistor having a gate, a source and a drain terminal and further comprising a second transistor having gate, source and drain terminal; the source and gate of the first transistor of said cascode circuits being respectively connected to a first reference voltage and to receive the input signal, the drain of said first transistor being connected to the source of said second transistor, the drain of which being coupled to said output; and
   a control circuit receiving the input voltage sensed by said sensing means for generating a set of control signals which are transmitted to the gates of the second transistors of said n cascode circuits;
   wherein the sensing means comprises:
      an additional cascode circuit comprising a first transistor having a gate, a source and a drain terminal and a second transistor having gate, source and drain terminal; the source and gate of the first transistor of said cascode circuits being respectively connected to the first reference voltage and to receive the input signal, the drain of said first transistor being coupled to the source of said second transistor, and
      a passive circuit coupled between a second reference voltage and the drain of said second transistor of said additional cascode circuit, said passive circuit comprising two resistors mounted as a voltage divider and, in parallel, one capacitor for averaging the RF signal sensed by said sensing means;

so as to activate or deactivate some of said n cascode circuits and adapt the size of the transistors to the output power to issue to a load.

12. Power amplifier circuit comprising an input, an output comprising:
   means for sensing an input voltage;
   a set of n cascode circuits, each comprising a first transistor having a gate, a source and a drain terminal and further comprising a second transistor having gate, source and drain terminal; the source and gate of the first transistor of said cascode circuits being respectively connected to a first reference voltage and to receive the input signal, the drain of said first transistor being connected to the source of said second transistor, the drain of which being coupled to said output; and
   a control circuit receiving the input voltage sensed by said sensing means for generating a set of control signals which are transmitted to the gates of the second transistors of said n cascode circuits;

wherein the sensing means comprises:
   an additional cascode circuit comprising a first transistor having a gate, a source and a drain terminal and a second transistor having gate, source and drain terminal; the source and gate of the first transistor of said cascode circuits being respectively connected to the first reference voltage and to receive the input signal, the drain of said first transistor being coupled to the source of said second transistor, and
   a passive circuit coupled between a second reference voltage and the drain of said second transistor of said additional cascode circuit, said passive circuit comprising two resistors mounted as a voltage divider and, in parallel, one capacitor for averaging the RF signal sensed by said sensing means; and
   the voltage across one of said resistors is transmitted to one input of said control circuit so as to determine the magnitude of the input signal to be amplified and, therefore, the number of cascode elements to activate/deactivate;
   so as to activate or deactivate some of said n cascode circuits and adapt the size of the transistors to the output power to issue to a load.

* * * * *

UNITED STATES PATENT AND TRADEMARK OFFICE
CERTIFICATE OF CORRECTION

PATENT NO. : 9,166,527 B2
APPLICATION NO. : 13/996758
DATED : October 20, 2015
INVENTOR(S) : Vincent Knopik Page 1 of 1

It is certified that error appears in the above-identified patent and that said Letters Patent is hereby corrected as shown below:

In the Specification

In Column 7, Line 5, delete "linearities" and insert -- linearities. --, therefor.

In the Claims

In Column 8, Line 10, in Claim 7, delete "comprising" and insert -- comprising: --, therefor.

Signed and Sealed this
Third Day of December, 2019

Andrei Iancu
*Director of the United States Patent and Trademark Office*